(12) United States Patent
Hansen

(10) Patent No.: US 7,057,707 B2
(45) Date of Patent: Jun. 6, 2006

(54) METHOD AND DEVICE FOR ADJUSTING AN ALIGNMENT MICROSCOPE BY MEANS OF A REFLECTIVE ALIGNMENT MASK

(75) Inventor: Sven Hansen, Kiefersfelden (DE)

(73) Assignee: Suss MicroTec Lithography GmbH, Garching (DE)

( * ) Notice: Subject to any disclaimer, the term of this patent is extended or adjusted under 35 U.S.C. 154(b) by 110 days.

(21) Appl. No.: 10/767,124

(22) Filed: Jan. 29, 2004

(65) Prior Publication Data
US 2004/0257552 A1   Dec. 23, 2004

(30) Foreign Application Priority Data
Jan. 31, 2003   (DE) ................. 103 03 902

(51) Int. Cl.
G03B 27/52 (2006.01)
G03B 27/42 (2006.01)
G01B 11/00 (2006.01)
G01N 21/86 (2006.01)

(52) U.S. Cl. .................. 355/55; 355/53; 356/399; 250/548

(58) Field of Classification Search ............ 355/53, 355/55; 356/399–401; 250/548; 430/5, 430/22, 30
See application file for complete search history.

(56) References Cited

U.S. PATENT DOCUMENTS 5,500,736 A * 3/1996 Koitabashi et al. ......... 356/620
5,739,899 A * 4/1998 Nishi et al. .................. 355/53
6,340,821 B1   1/2002 Brown ......................... 250/548
2003/0211409 A1* 11/2003 Nunes ........................... 430/22
2005/0117140 A1*  6/2005 Mishima ....................... 355/72

FOREIGN PATENT DOCUMENTS

DE   42 42 632     5/1994
DE   100 18 810   10/2001

OTHER PUBLICATIONS

Y. Tanaka, R. Matsuda, K. Shinoyamaa, J. Homma; The Latest Alignment Technology in PCB Step-and-Repeat Projection Exposure System; Apr. 2001; IPC Printed Circuits Expo, 2001; pp. S18-2-1 to S18-2-7.*

* cited by examiner

Primary Examiner—Michael Tokar
Assistant Examiner—Vivian Nelson
(74) Attorney, Agent, or Firm—Perman & Green, LLP.

(57) ABSTRACT

The present invention provides for a method for adjusting an alignment microscope. In the method of the present invention an alignment mask is used in which the one side comprises at least one alignment mark and the other side is reflective. For the adjustment, the microscope is first focused to the alignment mark and then refocused to the mirror image of the alignment mark generated by the reflective side. The microscope is then adjusted by comparing the positions of the alignment mark and the generated mirror image of the alignment mark until the alignment mark overlaps its mirror image. Moreover, a device for adjusting an alignment microscope in accordance with the method of the present invention.

8 Claims, 3 Drawing Sheets

(a)

(b)

(c)

(d)

METHOD AND DEVICE FOR ADJUSTING AN ALIGNMENT MICROSCOPE BY MEANS OF A REFLECTIVE ALIGNMENT MASK

This application claims benefit of the earlier filed German Application No. 103 03 902.3-42, filed Jan. 31, 2003.

FIELD OF THE INVENTION

The present invention relates to a method and a device for adjusting alignment microscopes. In the method of the present invention an alignment mask is used in which the one side comprises alignment marks and the other side is partially or fully reflective. It is necessary to adjust alignment microscopes in the perpendicular direction if the adjustment marks to be positioned are located in different objective distances.

BACKGROUND OF THE INVENTION

Alignment microscopes, in particular so-called BSA (bottom side alignment) microscopes are used if substrates or wafers which have their alignment marks on their bottom sides have to be adjusted with respect to exposure masks. The structure of such an alignment system is schematically shown in FIG. 1. Before loading the wafer 2 into the system, the microscope 1 is first focused to the alignment mark of the exposure mask 3 and the image of this mark is centered. The position of the alignment mark is stored, and subsequently the wafer 2 is inserted between the microscope 1 and the mask 3. The microscope is then focused to the alignment mark located on the wafer 2. Finally, the position of the wafer 2 is changed in the focusing plane until the mark on the wafer 2 is adjusted with respect to the mark on the mask 3; for this purpose, the stored position of the mark on the mask 3 is superimposed on a monitor with the current position of the mark on the wafer 2 so that an alignment is possible.

During this adjustment process, the alignment microscope 1 must be strongly refocused. However, this requires that previously the microscope 1 has been adjusted exactly, i.e. that the optical axis 11 of the microscope 1 is as perpendicular as possible to the plane of the mask 3 or wafer 2.

In known methods for adjusting alignment microscopes so-called double mark masks are used. FIG. 2(a) schematically shows such a construction for performing such a known adjustment method. The (transparent) double mark masks 4 comprise alignment marks both on their top surface 42 and their bottom surface 41, e.g. cross structures 44 and 43, respectively, which were adjusted with respect to each other by the mask manufacturer. For adjusting the alignment microscope, a double mark mask 4, instead of the mask 3, is loaded into the alignment system. The alignment is performed in that the microscope is first focused to the alignment mark 43 on the bottom side 41 of the double mark mask. After the microscope 1 has been adjusted so that the alignment mark 43 is in the focus, its position is stored and then the alignment microscope 1 is refocused to the upper side 42 of the mask. The position of the alignment mark 43 stored previously is then compared with the live image of the alignment mark 44. The alignment microscope 1 is adjusted until the alignment marks are superimposed in both images and overlap one another. For simplifying the alignment, the upper cross structures 44 can also be shaped as double lines.

It is extremely difficult to manufacture double mark masks in which the alignment marks on the top and bottom sides of the mask have been adjusted with the required accuracy with respect to each other. The manufacture of such double mark masks is therefore very expensive.

U.S. Pat. No. 6,340,821 describes a projection eyepiece and a method for aligning patterned areas on a substrate surface having a micro-optical device on an opposite surface side of the substrate. In the described method for aligning the alignment microscope and the optical axis of a micro-mirror device, a real image of the reticle projected by the projection eyepiece is compared with the image of the reticle reflected by the micro-mirror after the mask aligner and the mirror on the substrate have been roughly aligned. Further background information can be found in documents DE-A-100 18 810 and DE-C-42 42 632.

It is the object of the present invention to provide an improved method for adjusting alignment microscopes. Moreover, the present invention provides for an improved device for adjusting alignment microscopes which can be manufactured in a simpler and more cost-saving manner but still guarantees the required accuracy in connection with the adjustment of the microscope.

This object is achieved with the features of the claims.

SUMMARY OF THE INVENTION

In the method of the present invention a double mark mask is replaced by an alignment mask in which the one side comprises at least one alignment mark and the other side is reflective. The reflective side can be partially reflective (partially transparent) or fully reflective. The alignment microscope is adjusted analogously to the known methods comprising a double mark mask. In the present invention the microscope is first focused to one of the alignment marks on the bottom side of the mask, and preferably the position or the microscope image of the alignment mark is stored. The microscope is then refocused to the mirror image of the alignment mark. The position (or microscope image) of the mirrored alignment mark is then compared with the stored position (or the stored microscope image) and subsequently the alignment microscope is adjusted until the stored position and the position of the mirror image or the two microscope images correspond to each other.

Vis-à-vis conventional double mark masks, the use of reflective alignment masks has the following advantages: As compared to the double mark masks used so far, reflective alignment masks can be produced more easily because the very difficult adjustment of the alignment marks on the one side with respect to the marks on the other side is not necessary. Thus, reflective marks are easier available and clearly cheaper. Moreover, the method of the present invention provides for an improved accuracy because positioning errors during the writing of the mask are avoided.

BRIEF DESCRIPTION OF THE DRAWINGS

In the following the invention will be explained in more detail with reference to the attached drawings in which.

DESCRIPTION OF PREFERRED EMBODIMENT

Figure 1:
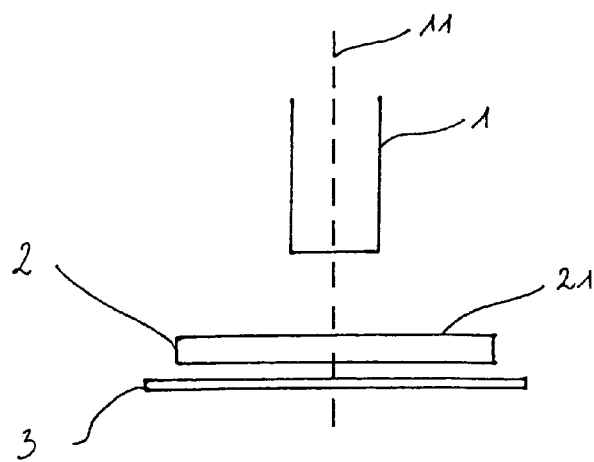
FIG. 1 shows the schematic construction of an alignment microscope system.

FIG. 2(b) schematically shows a construction for adjusting an alignment microscope by means of a reflective alignment mask of the present invention. On its side 51 facing the microscope, the alignment mask 5 has one or a plurality of alignment marks 53, and the back side 52 of the alignment mask 5 is partially or fully reflective at least in the area of the alignment mark 53. Therefore, at least in case of exactly parallel upper and lower sides of the mask in the area of the alignment mark 53, the mirror image 53' of the alignment mark 53, which is generated by the reflective area 52, is exactly perpendicular vis-à-vis the alignment mark 53. This property, i.e. that the two alignment marks are exactly opposite to one another with respect to a plane of the alignment mask, has not been achieved exactly in the known double mark masks 4 in which the alignment marks are attached on both sides and can only be manufactured with a slight tolerance in extremely involved processes. Moreover, the alignment masks 5 of the present invention only have to have half the thickness of known double mark masks 4.

In the method of the present invention, the alignment microscope 1 is focused to the alignment mark 53 on the one side 51 of the alignment mask, preferably the image of one of the alignment marks is centered, and the position of the alignment mark is stored. Subsequently, the microscope is refocused to the mirror image 53' of the alignment mark 53 generated by the reflective side 52 (mirror area 54). The position of the now visible mirror image 53' and the position of the alignment mark 53 stored previously are preferably simultaneously displayed (superimposed), for example on a monitor. The microscope 1 is then adjusted until the position of the mirror image 53' and the position of the alignment mark 53 stored previously correspond to each other. The adjustment of the microscope is an iterative process in which both the positions of the alignment mark 53 and the mirror image 53' change.

Figure 3:
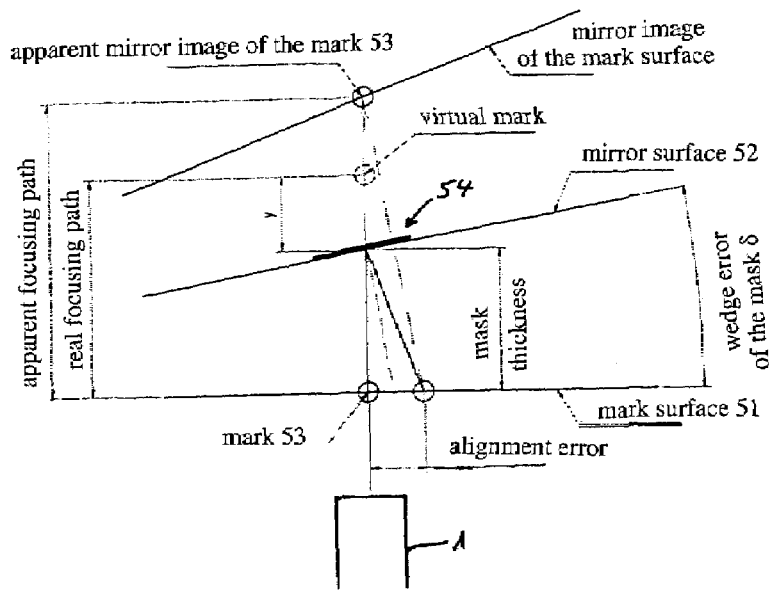
FIG. 3 shows a diagram clarifying the alignment error caused by the wedge error of an alignment mask of the present invention.

FIG. 3 schematically shows an alignment error which may occur due to a wedge error of the mask when an alignment mask of the invention is used. The alignment error f results in accordance with the following equation from the mask thickness d and the wedge error (wedge angle) δ of the mask:

$$f = 2*d*\delta.$$

In masks having a parallelism error of 5 μm, a square mask having an edge length of 7"×7" (17.8 cm×17.8 cm) has a wedge error of 5.8 angular seconds; with a mask thickness of 2 mm the alignment error is 0.11 μm, with a mask thickness of 3 mm the alignment error is 0.17 μm, and with a mask thickness of 4.5 mm the alignment error is 0.25 μm. The thus calculated alignment errors are solely caused by the wedge error of the alignment mask or the inclination of the mirror surface vis-à-vis the reference area. Here (in case of small wedge angles), the alignment error is directly proportional to the parallelism deviation of the mask.

If such an alignment mask which is reflective on one side is loaded into the mask holder like an application mask, the focus area of the alignment microscope must be shifted towards the top by the entire focus area so that the real and virtual (mirrored) marks are visible in the alignment microscope for the purpose of alignment. This is necessary because in normal alignment applications the uppermost focal point must just reach the structured mask plane and the entire focusing path towards the bottom is available for the alignment distance and the substrate thickness. If the entire focusing path should be used by an alignment mask so that the best possible adjustment of the alignment microscope is achieved, the lowermost focal point must be able to reach the lower mark and the uppermost focal point must be able to reach the upper mark, i.e. the mirror image of the mark in case an alignment mark of the present invention is used. In this case, however, the alignment microscope is too high by the entire focusing path for the alignment process.

There are two ways how to compensate for this shifting of the focus area: Either, the alignment microscope is shifted downwards by the entire focus area after adjustment in order to arrange it in accordance with the application, or, with its mark plane, the alignment mask is arranged below the respective desired position of the application mask by the entire focus area.

In both cases there is an additional error source which, in connection with the possible direction error resulting from the shifting of the alignment microscope or a parallelism error between the mirror plane of the alignment mask and the reference plane, leads to the same alignment errors as those calculated above. The assumed value of 5.8 angular seconds is a very close tolerance.

In order to avoid the shifting of the alignment microscope, it is possible to use an alignment mask which, in addition to a mask being reflective on one side, comprises a means for compensating the shifting of the necessary focus area. For this purpose, for example, the reflective side of the reflective mask having alignment marks on the side opposite to the reflective side can be attached, e.g. cemented, to a carrier plate. The carrier plate must be so thick that the focus area is shifted by the required distance. Thus, after the alignment process the alignment microscope can maintain its position.

Figure 4:
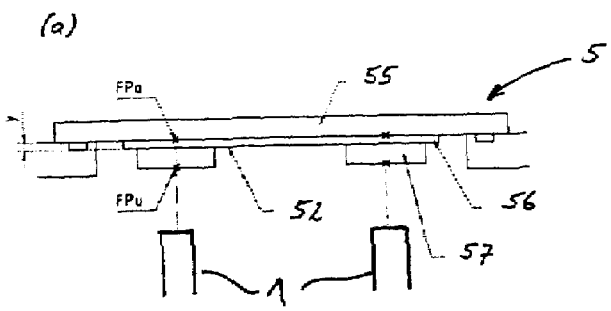
FIGS. 4 (a) to (d) show diagrams of possible solutions by means of which the shifting of the alignment microscope can be avoided.
Figure 4:
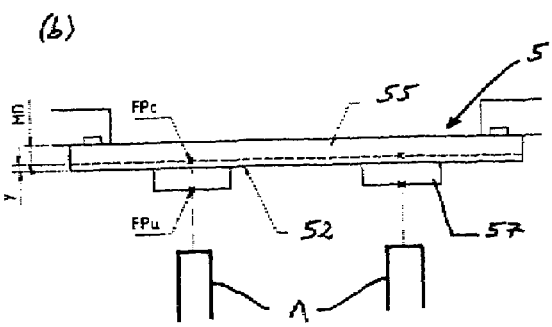
Figure 4:
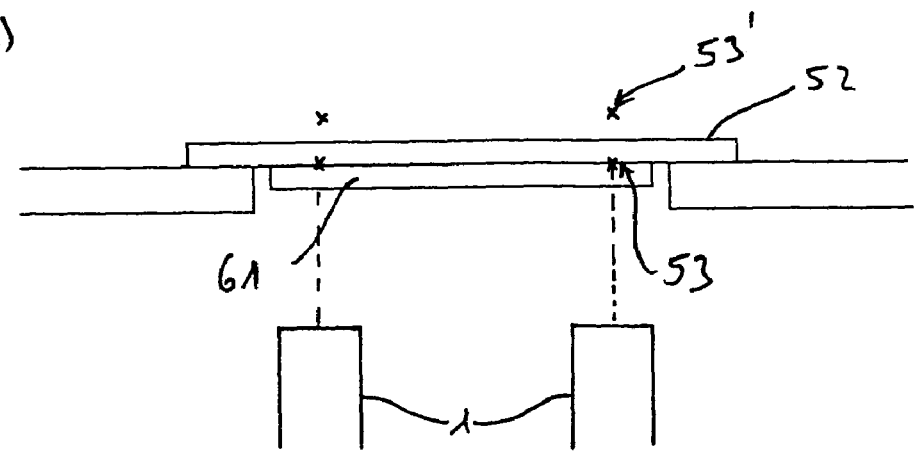
Figure 4:
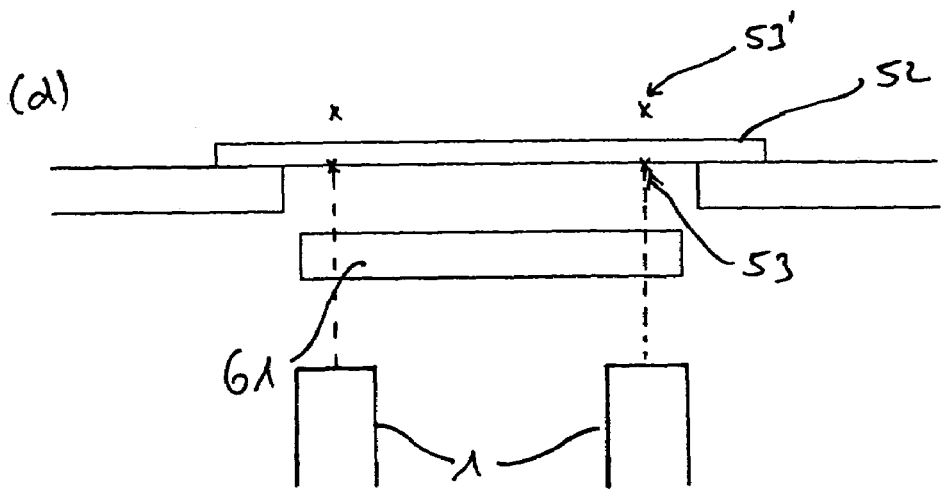

FIGS. 4(a) and (b) illustrate two preferred solutions for avoiding the shifting of the alignment microscope. The upper or lower focal points are designated as FPo and FPu, respectively, y is the distance between the virtual image of the alignment mark and the mirror surface, and MD is the thickness of a conventional application mask.

The top load variant shown in FIG. 4(a) requires a carrier plate 55 which has a plane reference plane to which an intermediate plate 56 having a thickness y and being reflective on its lower side 52 is attached. Portions 57 on which alignment marks are located are attached to specific positions of this intermediate plate 56. The accuracy requirement to be met in this case is that after attachment the mirror surface 52 of the intermediate plate 56 is parallel to the reference surface of the carrier plate 55.

Alternatively, in the top load variant the intermediate plate 56 can be omitted and the reference surface of the carrier plate 55 can be reflective. This means that the two focal points are shifted upwards by the measure y, and the usable focus area is reduced by the measure y. The required parallelism of the mirror surface 52 and the reference surface is thus very well ensured.

The bottom load variant shown in FIG. 4(b) requires a carrier plate 55 whose thickness is greater by the measure y than that of a common application mask. The lower side 52 is reflective. Portions 57 on which alignment marks are located are attached to specific positions of this carrier plate 55. The accuracy requirement to be met in this case is that the carrier plate 55 is parallel.

Figure 2:
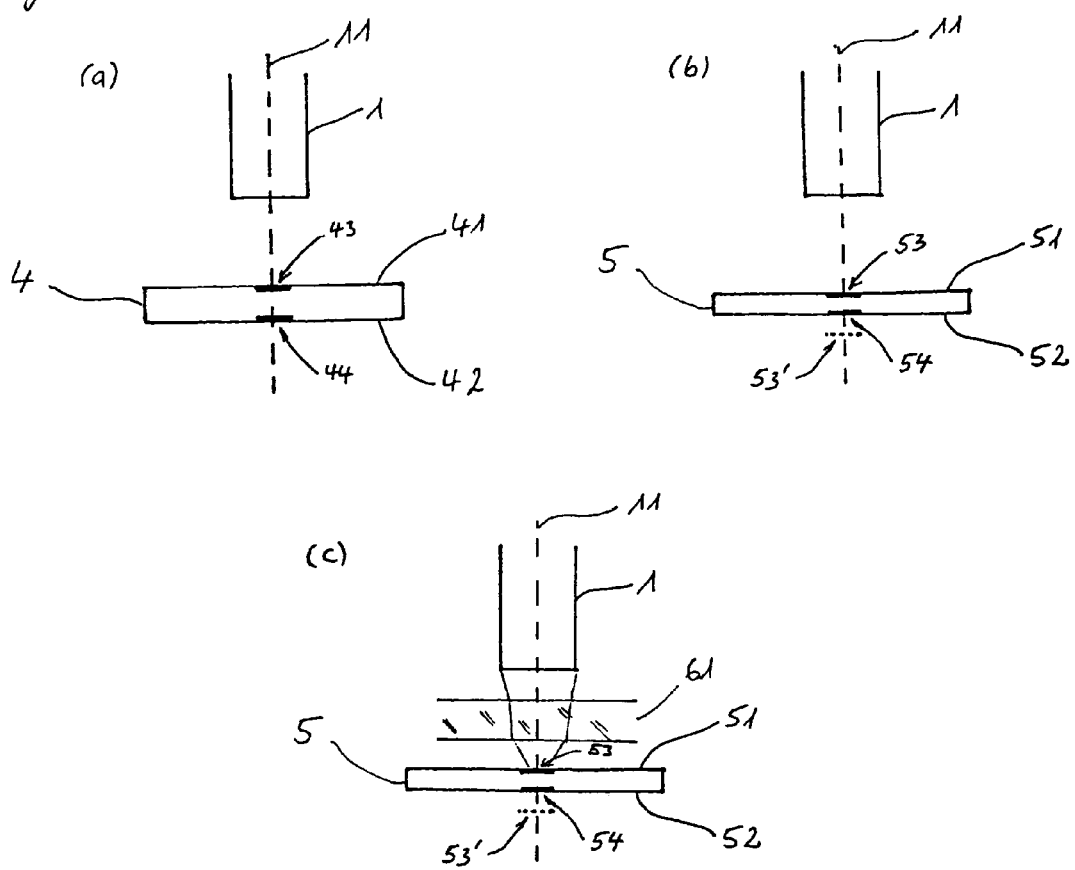
FIG. 2 shows the schematic construction for adjusting an alignment microscope (a) by means of a known double mark mask and (b) and (c) by means of a reflective alignment mask according to the present invention, wherein in (c) a transparent plane-parallel plate for correcting the mirror image planes is additionally used.

Instead of shifting the mirror image of the alignment mark into the mask plane by means of the intermediate plate 56 or the portions 57, as described above, the mirror image planes can also be corrected by a transparent plane-parallel plate between the alignment mark and the alignment microscope. Such a construction is schematically shown in FIG. 2 (c). The thickness and/or the refractive index of the correction plate 61 can be selected such that the necessary shifting of the mirror image plane is achieved. For instance, a glass plate can be used. As shown in FIGS. 4(c) and (d), the correction plate 61 can either be attached directly to the alignment mask or can be held in the optical path between microscope and alignment mask.

If the direction of the alignment microscope is changed after the alignment by shifting it in the z-direction, i.e. perpendicular to the plane of the mask, but also by shifting it in the x-y plane, i.e. parallel to the mask plane, the same alignment error is caused than that caused by a wedge error between the mirror surface and the reference plane. For calculating the generated alignment error, the same formula can be used than that for calculating the alignment error caused by the wedge error of the mask. The wedge error only needs to be replaced by the directional error during the shifting. In the alignment methods and combined alignment masks of the present invention, there is therefore no reason to allow the alignment microscope to be shiftable in the z-direction.

What is claimed is:

1. A method for adjusting an alignment microscope (1) comprising the steps:
   (a) providing an alignment mask (5) in which one side (51) comprises at least one alignment mark (53) and the other side (52) is reflective in at least the area (54) opposite to the alignment mark (53);
   (b) focusing the microscope (1) to the alignment mark (53);
   (c) refocusing the microscope (1) to the mirror image (53') of the alignment mark (53) being generated by the reflective side (52);
   (d) comparing the position of the alignment mark (53) and that of the generated mirror image (53') of the alignment mark (53);
   (e) adjusting the microscope (1) so that the alignment mark (53) and the mirror image (53') thereof superimpose; and
   (f) repeating steps (b) to (e) until the comparison in step (d) reveals that the alignment mark (53) and the mirror image (53') of the alignment mark (53) are aligned with respect to each other.

2. The method according to claim 1, wherein at least one alignment cross serving as the alignment mark is located on the alignment mask (5).

3. The method according to claim 1, wherein, after step (b) has been carried out once, the microscope is adjusted such that the alignment mark (53) is located in the center of the image.

4. The method according to claim 1, wherein after focusing in step (b) the image and/or the position values of the alignment mark is/are stored.

5. The method according to claim 4, wherein in step (f) only steps (d) and (e) are repeated and in step (d) the position of the mirror image (53') of the alignment mark (53) is compared with the position of the alignment mark (53) in the stored image.

6. A method for exposing a substrate through an exposure mask comprising the steps:
   adjusting an alignment microscope (1) according to claim 1;
   adjusting the exposure mask and the substrate with respect to each other by
   means of the adjusted alignment microscope; and
   exposing the substrate through the exposure mask.

7. The method according to claim 6, wherein the focus area of the alignment microscope (1) is shifted between the steps of adjusting the alignment microscope (1) and adjusting the exposure mask and the substrate with respect to each other.

8. The method according to claim 6, wherein it is possible to avoid that the focus area of the alignment microscope (1) is shifted between the steps of adjusting the alignment microscope (1) and adjusting the exposure mask and the substrate with respect to each other by the use of a transparent plane-parallel correction plate (61) during the adjustment of the alignment microscope (1).

* * * * *